(12) United States Patent
Yoneda et al.

(10) Patent No.: US 7,056,825 B2
(45) Date of Patent: Jun. 6, 2006

(54) METHOD FOR MANUFACTURING A SEMICONDUCTOR DEVICE THAT INCLUDES PLASMA TREATING AN INSULATING FILM WITH A MIXTURE OF HELIUM AND ARGON GASES

(75) Inventors: Katsumi Yoneda, Tokyo (JP); Toru Yoshie, Chiba (JP)

(73) Assignee: Renesas Technology Corp., Tokyo (JP)

( * ) Notice: Subject to any disclaimer, the term of this patent is extended or adjusted under 35 U.S.C. 154(b) by 236 days.

(21) Appl. No.: 10/855,466

(22) Filed: May 28, 2004

(65) Prior Publication Data

US 2004/0248395 A1    Dec. 9, 2004

(30) Foreign Application Priority Data

Jun. 5, 2003    (JP)    ............... 2003-161277

(51) Int. Cl.
*H01L 21/4757*    (2006.01)
(52) U.S. Cl. ............ 438/624; 438/763; 438/798
(58) Field of Classification Search .......... 438/798
See application file for complete search history.

(56) References Cited

U.S. PATENT DOCUMENTS

| | | | |
|---|---|---|---|
| 5,858,882 A | 1/1999 | Chang et al. | |
| 5,928,480 A * | 7/1999 | Leiphart | ............ 204/192.13 |
| 5,962,344 A | 10/1999 | Tu et al. | |
| 6,106,683 A * | 8/2000 | Ohkawa | ............ 204/298.36 |
| 6,124,216 A | 9/2000 | Ko et al. | |
| 8,140,225 | 10/2000 | Usami et al. | |
| 6,225,236 B1 | 5/2001 | Nishimoto et al. | |
| 6,358,841 B1 | 3/2002 | Bao et al. | |
| 6,524,972 B1 | 2/2003 | Maeda | |
| 6,784,485 B1 | 8/2004 | Cohen et al. | |
| 2002/0033486 A1 | 3/2002 | Kim et al. | |
| 2003/0082924 A1 | 5/2003 | Andideh et al. | |
| 2003/0228413 A1* | 12/2003 | Ohta et al | ............ 427/162 |

FOREIGN PATENT DOCUMENTS

| | | |
|---|---|---|
| JP | 08-111458 A | 4/1996 |
| JP | 2000-68096 A | 3/2000 |
| JP | 2000-68261 A | 3/2000 |
| JP | 2000-106364 A | 4/2000 |
| JP | 2000-332011 A | 11/2000 |
| JP | 2001-274250 A | 10/2001 |
| JP | 2001-291872 A | 10/2001 |
| JP | 2002-026121 A | 1/2002 |
| JP | 2002-370059 A | 12/2002 |
| JP | 2003-309173 A | 10/2003 |
| TW | 469532 A | 12/2001 |

* cited by examiner

*Primary Examiner*—Stephen W. Smoot
(74) *Attorney, Agent, or Firm*—Leydig, Voit & Mayer, Ltd.

(57) ABSTRACT

In a method for manufacturing a semiconductor device having a multi-layer insulating film, a first insulating film is formed as one layer of the multi-layer insulating film, and a plasma treatment is performed on the surface of the first insulating film in an ambient of helium and argon, containing 5 to 31% Ar. After the plasma treatment, a second insulating film, different from the first insulating film, is formed on the first insulating film as another layer of the multi-layer insulating film.

19 Claims, 5 Drawing Sheets

METHOD FOR MANUFACTURING A SEMICONDUCTOR DEVICE THAT INCLUDES PLASMA TREATING AN INSULATING FILM WITH A MIXTURE OF HELIUM AND ARGON GASES

BACKGROUND OF THE INVENTION

1. Field of the Invention

The present invention relates to a method for manufacturing a semiconductor device that has a multi-layer insulating film as an interlayer insulating film for buried Cu wirings.

2. Background Art

In recent years, as the wiring pitch has been reduced in semiconductor integrated circuits, the problem of signal delay due to increase of the resistance of metal wirings and the capacitance of interlayer insulating films has become serious. In order to solve this problem, it has become essential to use Cu as the wiring material, and a low-dielectric-constant film (low-K film) as the interlayer insulating film. The interlayer insulating film for buried Cu wirings is formed of a multi-layer insulating film wherein a plurality of insulating films are laminated. In addition to the low-K film, the multi-layer insulating film has a Cu barrier film for preventing the diffusion of Cu from the underlying buried Cu wirings into the low-K film, an etching stopper film for forming wiring vias or trenches, a hard mask and the like.

The examples of the low-K films used herein include an MSQ (alkyl silsesquioxane polymer) film, an HSQ (hydrogenated silsesquioxane polymer) film, an SiOC film, and an organic polymer film, formed using a spin coating method or a CVD (chemical vapor deposition) method. An insulating film having pores of several angstroms to several hundred angstroms, known as a porous low-K film, is also promising for further reducing the dielectric constant of interlayer insulating films in next-generation semiconductor devices. In addition, various films such as an $SiO_2$ film, SiN film, SiC film and SiCN film formed using a spin coating method or a CVD method are used as a Cu barrier film, an etching stopper film and the hard mask.

When various materials are combined to form a multi-layer insulating film, adhesion between different materials becomes poor due to difference in the properties of the materials, and a desired laminated structure cannot be obtained. Even if a desired laminated structure is obtained when initially formed, the multi-layer insulating film is peeled off at the boundary of the films due to mechanical stress from the CMP (chemical mechanical polishing) step in the subsequent formation of buried Cu wirings or the assembling step in the subsequent formation of buried Cu wirings, and reliability after completion is lost. If a porous low-K film is used, adhesion is further worsened, and the problem becomes more serious.

In order to solve these problems, in a conventional method for manufacturing a semiconductor device, plasma treatment is performed on the surface of a first insulating film in a single-gas atmosphere of $N_2$, He, Ne, Ar, or the like, and then, a second insulating film is formed on the first insulating film, to improve the adhesion of the first and second insulating films (Japanese Patent Laid-Open No. 2000-106364).

However, the conventional method has a problem that the dielectric constant of the first insulating film increases due to the spattering effect or the densification effect, if a plasma treatment for improving adhesion is performed.

SUMMARY OF THE INVENTION

The present invention has been devised to solve the above-described problems, and it is the object of the present invention to provide a method for manufacturing a semiconductor device that can improve the adhesion of the first and second insulating films, and can suppress the increase of the leakage current and the dielectric constant of the first insulating film.

According to one aspect of the present invention, in a method for manufacturing a semiconductor device, a first insulating film is formed as one layer of the multi-layer insulating film. Then, a plasma treatment is performed on the surface of the first insulating film in an atmosphere of He/Ar mixed gas containing 5 to 31% Ar. After the plasma treatment, a second insulating film different from the first insulating film is formed on the first insulating film as another layer of the multi-layer insulating film.

Other and further objects, features and advantages of the invention will appear more fully from the following description.

According to the present invention, the adhesion of the first and second insulating films can be improved, and the increase of the leakage current and the dielectric constant of the first insulating film can be suppressed.

DETAILED DESCRIPTION OF THE PREFERRED EMBODIMENTS

First Embodiment

The present invention relates to a method for manufacturing a semiconductor device that has a multi-layer insulating film as an interlayer insulating film for buried Cu wirings. An example of such a multi-layer insulating film according to the present invention is shown in FIG. 1.

Figure 1:
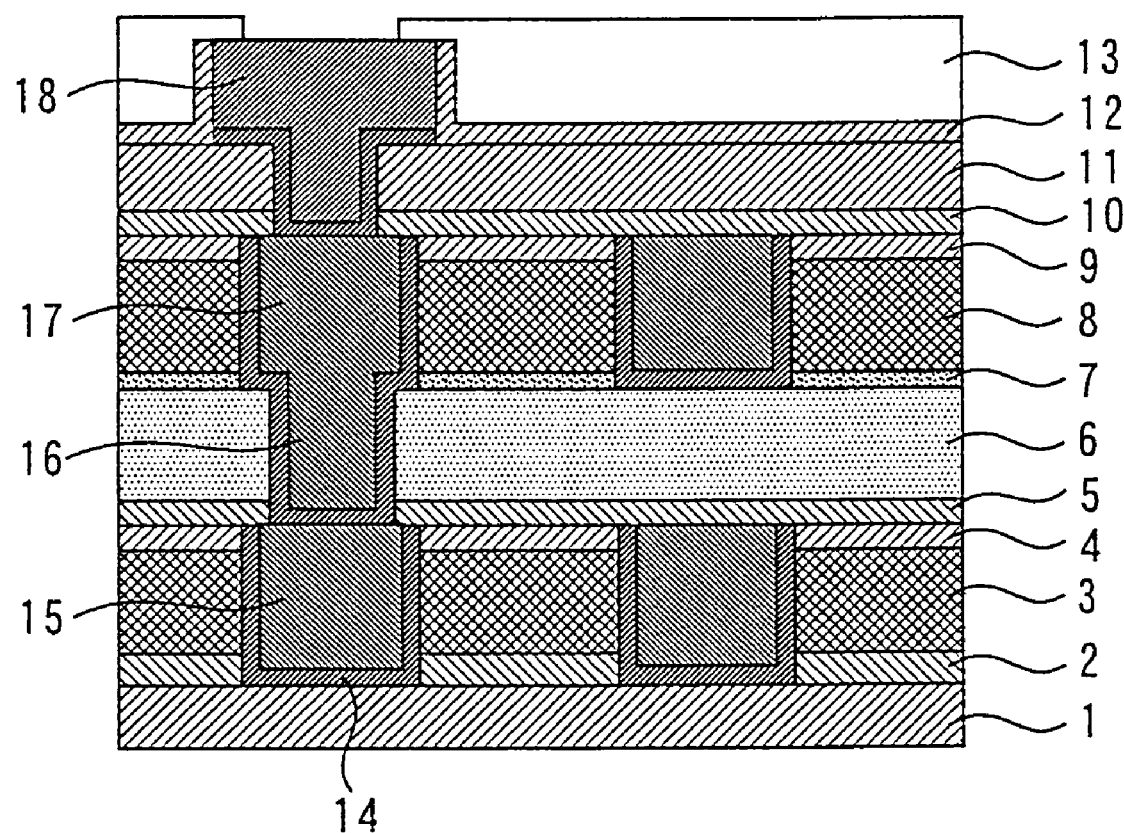
FIG. 1 shows an example of a multi-layer insulating film.

The multi-layer insulating film shown in FIG. 1 has, in the order from the bottom, an $SiO_2$ film 1; an SiC film 2 of a thickness of 50 nm, which is a stopper for processing a Cu barrier and a trench; an MSQ film 3 of a thickness of 250 nm, which is an interlayer insulating film for vias and trenches; an $SiO_2$ film 4 of a thickness of 50 nm, which is a hard mask for processing; an SiC film 5 of a thickness of 50 nm, which is a stopper for processing a Cu barrier and a trench; a fluorinated allylene film 6 of a thickness of 200 nm, which is an interlayer insulating film for vias; an adhesion promoter 7 of a film thickness of 5 to 15 nm containing a silane coupling agent; an MSQ film 8 of a thickness of 250 nm, which is an interlayer insulating film for vias and trenches; an $SiO_2$ film 9 of a thickness of 50 nm, which is a hard mask for processing; an SiC film 10 of a thickness of 50 nm, which is a stopper for processing a Cu barrier and a trench; an $SiO_2$ film 11 of a thickness of 500 nm, which is a hard mask for processing; an $SiO_2$ film 12 of a thickness of 100 nm; and an SiN film 13 of a thickness of 500 nm. A buried Cu wiring 15 is formed in the MSQ film 3 via a barrier film 14; a Cu via 16 is formed in the fluorinated allylene film 6; a buried Cu wiring 17 is formed in the MSQ film 8; and an AlCu wiring 18 of a thickness of 800 nm is formed in the $SiO_2$ films 11 and 12 and the SiN film 13. As the barrier film 14, a Ta film of a thickness of 15 nm, a TaN film of a thickness of 10 nm, and a Cu seed film of a thickness of 65 nm are formed using a physical vapor deposition (PVD) method.

Figure 2A:
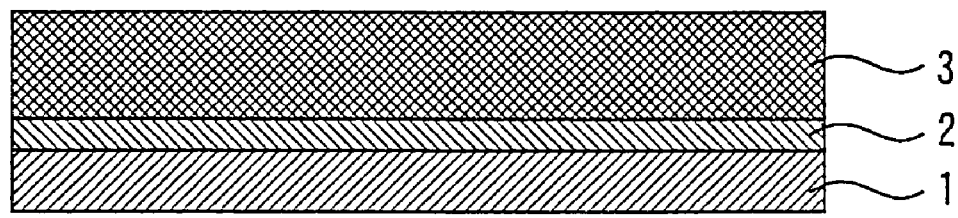
FIG. 2 shows a method for manufacturing a semiconductor device according to a first embodiment of the present invention.
Figure 2B:
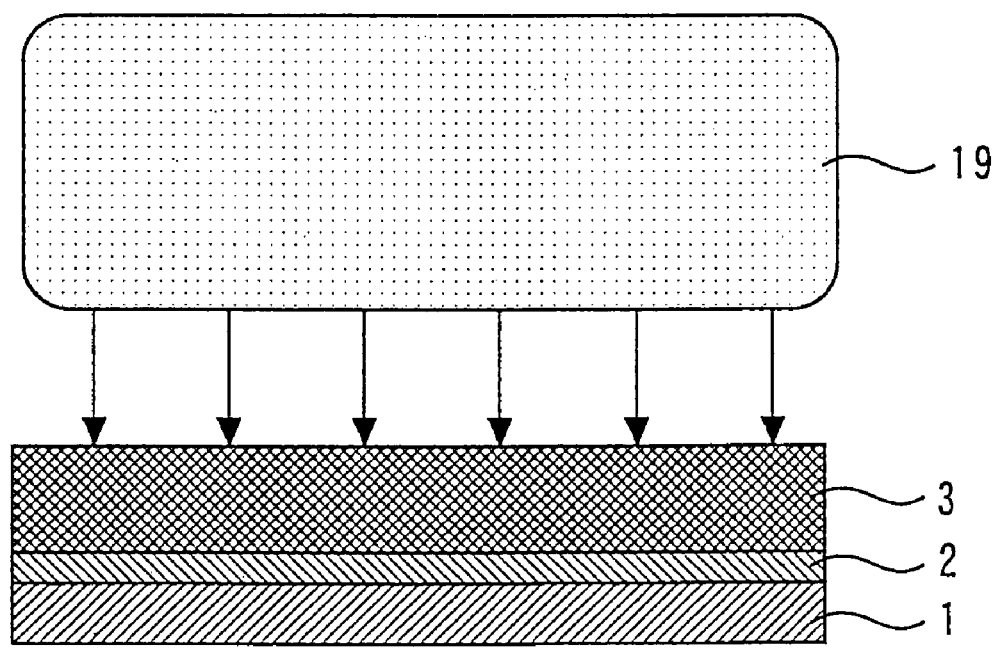
Figure 2C:
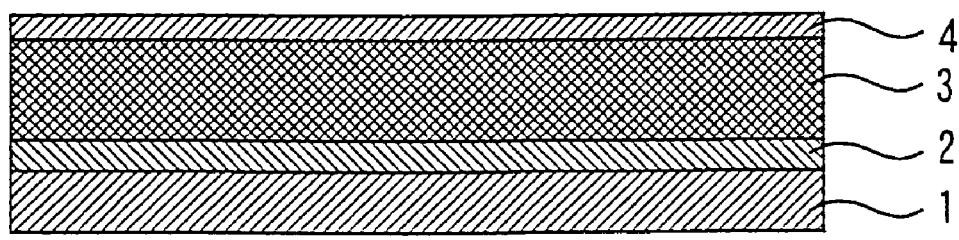

The method for manufacturing a semiconductor device according to the first embodiment of the present invention will be described below referring to FIGS. 2A to 2C. FIGS. 2A to 2C, however, show only a part of the multi-layer insulating film shown in FIG. 1, and components such as buried Cu wirings and a substrate are not shown. The components same as the components shown in FIG. 1 will be denoted by the same reference numerals, and the description thereof will be omitted.

First, as FIG. 2A shows, a SiC film 2 is formed on a $SiO_2$ film 1 using a plasma CVD method, and a MSQ film 3 is formed thereon by a spin coating method as a first insulating film.

Next, as FIG. 2B shows, a plasma treatment using plasma 19 is performed on the surface of the MSQ film 3. This plasma treatment is performed for 15 seconds using a plasma CVD chamber (not shown), by introducing He gas at a gas flow rate of 1 slm, adding Ar gas at a gas flow rate of 300 sccm thereto, maintaining the pressure at 1.0 Pa and the heater temperature at 400° C., and impressing two-frequency RF power of 13.56 MHz/1000 W and 430 kHz/400 W.

After this plasma treatment, as FIG. 2C shows, a $SiO_2$ film 4, which is the second insulating film, is formed on the MSQ film 3 using the same plasma CVD chamber.

By thus performing plasma treatment, the adhesiveness of the MSQ film 3 and the $SiO_2$ film 4 is improved, and a desired laminated structure can be obtained. Furthermore, the $SiO_2$ film 4 can be prevented from being peeled off at the boundary with the MSQ film 3 when performing CMP or the like for forming buried Cu wirings in the subsequent step. The plasma treatment can be performed on each surface of all the insulating films of the multi-layer insulating film, or can be selectively performed on the surfaces of insulating films of particularly poor adhesiveness.

Figure 3:
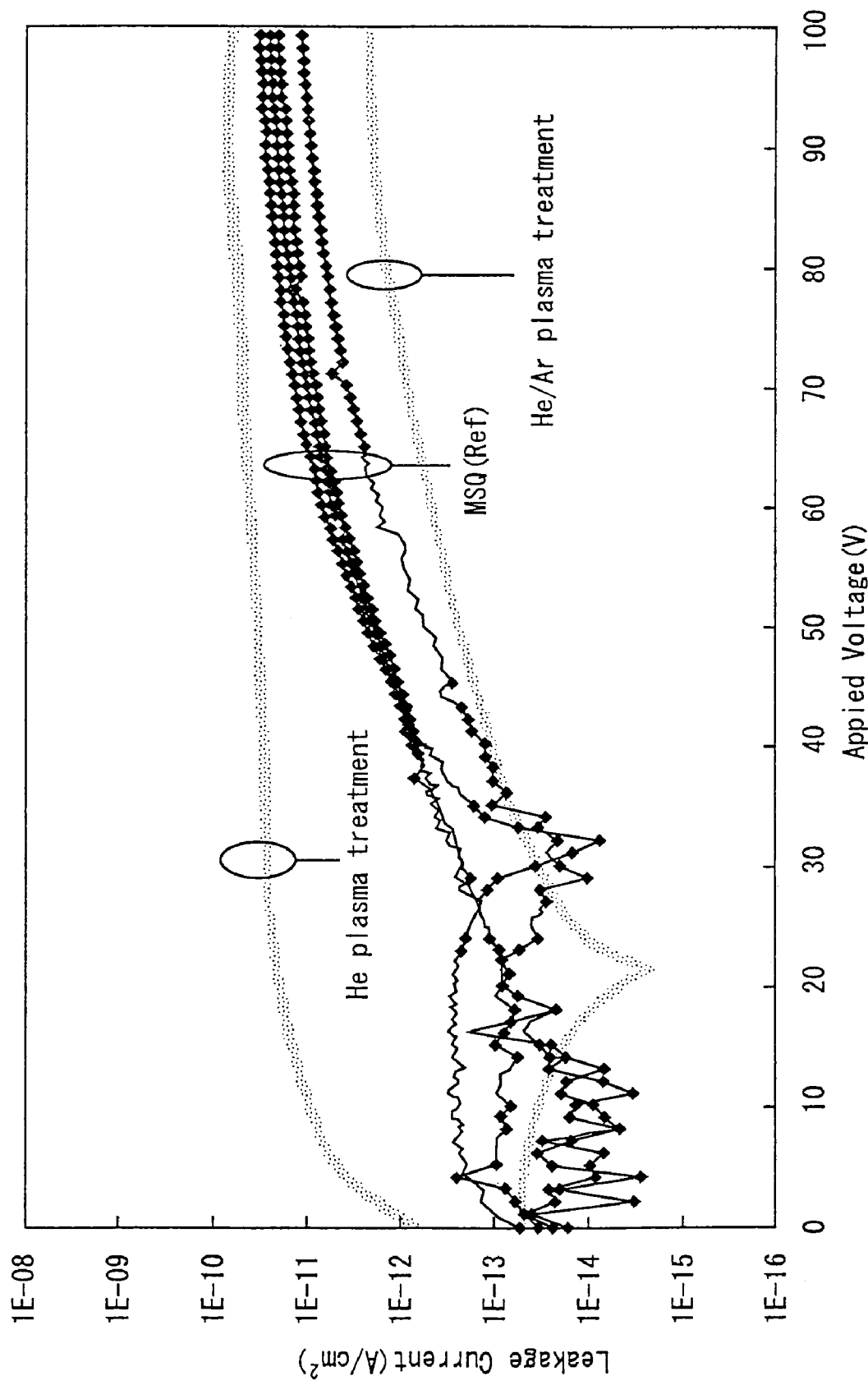
FIG. 3 shows the results of evaluation for the I-V characteristics of an MSQ film using a mercury probe.

An evaluation for the I-V characteristics of an MSQ monolayer film (thickness of 250 nm) was conducted using a mercury probe. As a result, as shown in FIG. 3, the I-V characteristics are deteriorated when the plasma treatment was performed in the atmosphere of He gas alone (shown as "He plasma treatment") compared with the I-V characteristics of the MSQ film before the plasma treatment (shown as "MSQ (Ref)"). This is considered due to the damages in the MSQ film. On the other hand, when plasma treatment is performed in an atmosphere of He/Ar mixed gas (shown as "He/Ar plasma treatment") as described above with reference to FIG. 2B, it was found that the I-V characteristics was not deteriorated.

The evaluation for the I-V characteristics was similarly performed after plasma treatment changing the percentage of Ar contained in He/Ar mixed gas. Table 1 shows the results of leakage current measured at a voltage of 50 V.

TABLE 1

| Percentage of Ar contained in mixed gas | Leakage current (A/cm$^2$) | |
|---|---|---|
| 0% | 4~6E−11 | X |
| 13% | 7~9E−13 | ○ |
| 23% | 7~9E−13 | ○ |
| 31% | 7~8E−13 | ○ |
| 37.5% | 7~8E−13 | ○ |

As a result, judging from the leakage current 1~2E-12 (A/cm$^2$) of MSQ film not subjected to plasma treatment as a reference value, it was found that the increase of leakage current could be suppressed if the percentage of Ar contained in He/Ar mixed gas was 13% or more. From above data, it was estimated that the increase of leakage current could be suppressed if the percentage of Ar contained in He/Ar mixed gas was approximately 5% or more.

On the other hand, when the percentage of Ar contained in He/Ar mixed gas increases, it is presumed that the MSQ film is damaged and the dielectric constant is increased due to the sputtering effect or the densification effect. Table 2 shows the results of measuring the dielectric constant of the MSQ film after plasma treatment changing the percentage of Ar contained in He/Ar mixed gas. In Table 2, the increase rate of the dielectric constant using the dielectric constant of the MSQ film not subjected to plasma treatment as the reference value is shown.

TABLE 2

| Percentage of Ar contained in He | Increase rate of dielectric constant | |
|---|---|---|
| 0% | 1.02 | ○ |
| 13% | 1.02 | ○ |
| 23% | 1.04 | ○ |
| 31% | 1.06 | ○ |
| 37.5% | 1.15 | X |

Judged from these results, using the dielectric constant of MSQ film not subjected to plasma treatment as the reference value, it was found that the increase rate of dielectric constant could be suppressed under 1.1 if the percentage of Ar contained in He/Ar mixed gas was 31% or less.

Therefore, in the method of manufacturing a semiconductor, device as shown in FIGS. 2A to 2C, by performing plasma treatment in an atmosphere of He/Ar mixed gas containing 5 to 31% Ar, the adhesion between the first and second insulating films can be improved, and the increase of the leakage current and the dielectric constant of the first insulating film can be suppressed. The percentage of Ar contained in He/Ar mixed gas is preferably 13 to 31%.

In the above-described example shown in FIGS. 2A to 2C, although an MSQ film 3 is formed using a spin coating method as the first insulating film, the present invention is not limited thereto, but other low-dielectric-constant film may also be formed. Specifically, a film of MSQ, fluorinated allylene, SiOC, an organic polymer, a material containing Si and $CH_3$ groups, or a material containing Si—H groups, or a porous film formed by dispersing pores in a low-dielectric-constant film may also be formed using a spin coating method or a CVD method as the first insulating film. Although a film having a low dielectric constant or a porous film is likely to be damaged by plasma treatment. But, this damage can be suppressed by applying this invention.

In the above-described example, although an SiO$_2$ film 4 is formed as the second insulating film, the present invention is not limited thereto, but a film of SiO$_2$, SiN, SiC, SiCN, SiOC or SiON may be formed using a spin coating method or a CVD method.

With increase in the time for plasma treatment, the adhesion between films is more improved, but the base material is heavily damaged. Therefore, the time for plasma treatment need to be optimized for the base material. Normally, the time for plasma treatment is preferably about 10 to 60 seconds.

In the above-described example, the present invention is applied to the formation of an SiO$_2$ film 4 on an MSQ film 3. However, the present invention is not limited thereto, but the present invention can be applied repeatedly in the formation of a multi-layer insulating film. For example, the present invention can also be applied to the formation of an SiO$_2$ film 9 on an MSQ film 8 shown in FIG. 1.

Second Embodiment

The method for manufacturing a semiconductor device according to the second embodiment of the present invention will be described below referring to FIG. 4. FIG. 4, however, shows only a part of a multi-layer insulating film shown in FIG. 1, and components such as buried Cu wirings and a substrate are not shown. The components same as the components shown in FIG. 1 will be denoted by the same reference numerals, and the description thereof will be omitted.

Figure 4A:
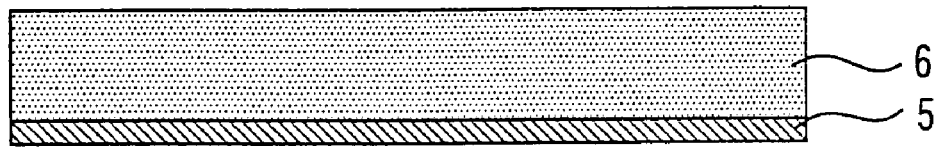
FIG. 4 shows a method for manufacturing a semiconductor device according to the second embodiment of the present invention.

First, as FIG. 4A shows, in the order from the bottom, an SiC film 5 is formed using a plasma CVD method, and a fluorinated allylene film 6, which is a first insulating film, is formed using a spin coating method.

Figure 4B:
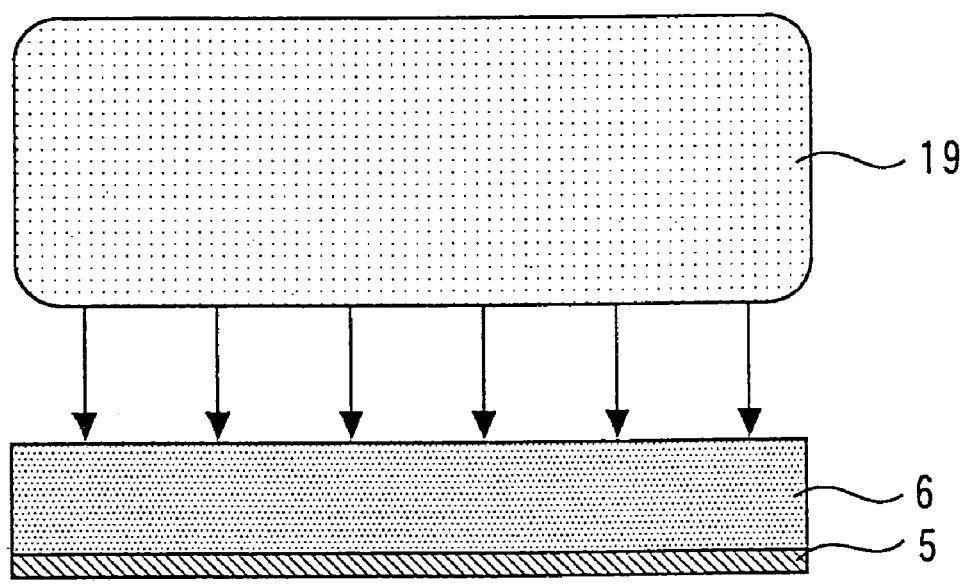

Next, as FIG. 4B shows, plasma treatment is performed on the surface of the fluorinated allylene film 6 in He/Ar mixed gas containing 5 to 31% Ar.

Figure 4C:
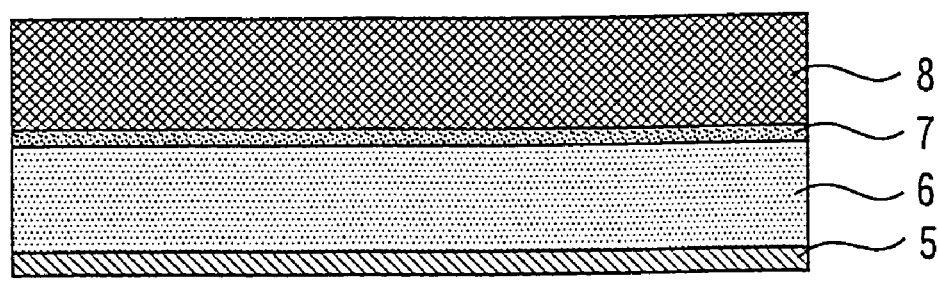

After the plasma treatment, as FIG. 4C shows, using the same plasma CVD chamber, an adhesion promoter 7 containing a silane coupling agent is applied onto the fluorinated allylene film 6 using a spin coating method, and an MSQ film 8, which is a second insulating film, is formed using a plasma CVD method. Here, the film thickness of the adhesion promoter 7 is preferably 5 to 20 nm, and most preferably about 10 nm.

Thereby, the same effect as the effect of the first embodiment can be achieved. Furthermore, if the MSQ film is directly applied onto the fluorinated allylene film 6, the MSQ film is repelled and cannot be formed. However, the application of the above-described plasma treatment and adhesion promoter enables the MSQ film 8 to be formed, and a desired laminated structure can be obtained.

Third Embodiment

The method for manufacturing a semiconductor device according to the third embodiment of the present invention will be described below referring to FIG. 5. FIG. 5, however, shows only a part of a multi-layer insulating film shown in FIG. 1, and components such as buried Cu wirings and a substrate are not shown. The components same as the components shown in FIG. 1 will be denoted by the same reference numerals, and the description thereof will be omitted.

Figure 5A:
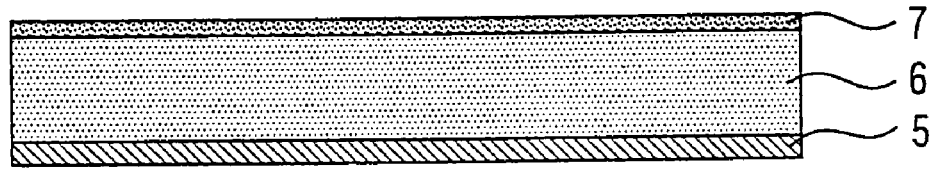
FIG. 5 shows a method for manufacturing a semiconductor device according to a third embodiment of the present invention.

First, as FIG. 5A shows, in the order from the bottom, an SiC film 5 is formed using a plasma CVD method, and a fluorinated allylene film 6, which is a first insulating film, is formed using a spin coating method. An adhesion promoter 7 containing a silane coupling agent is applied onto the fluorinated allylene film 6 using a spin coating method. Here, the film thickness of the adhesion promoter 7 is preferably 5 to 20 nm, and most preferably about 10 nm.

Figure 5B:
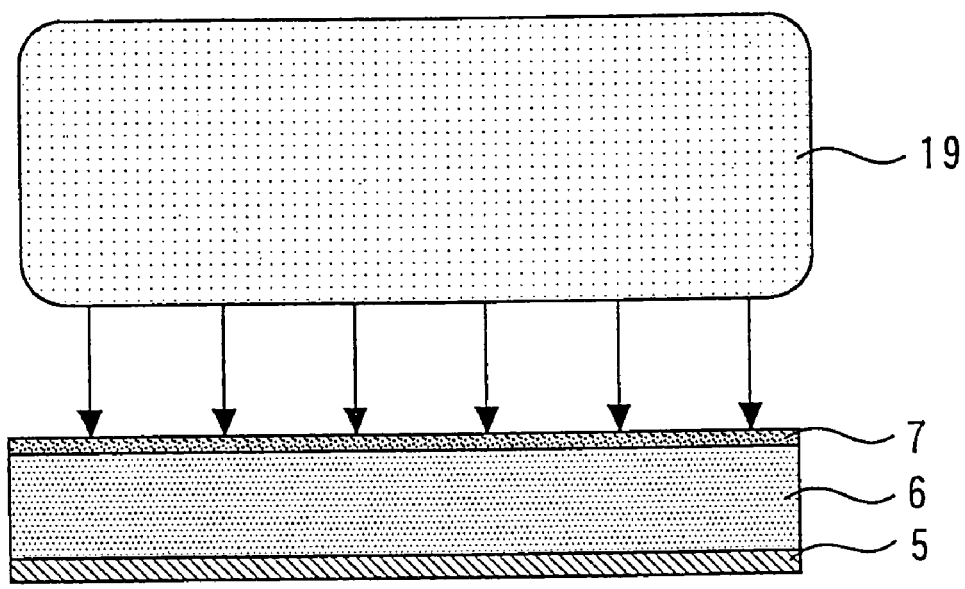
Figure 5C:
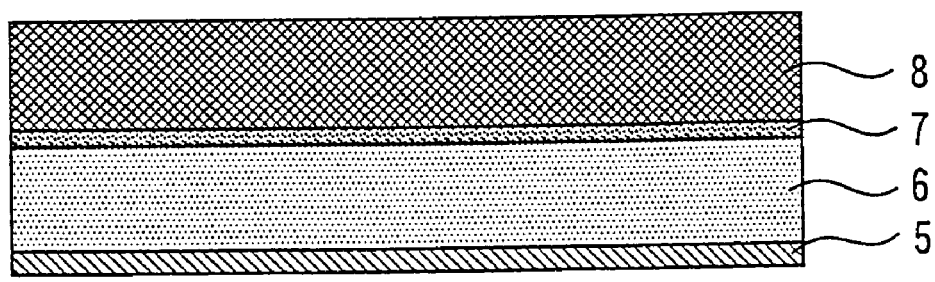

Next, as FIG. 5B shows, plasma treatment is performed on the surface of the adhesion promoter 7 in He/Ar mixed gas containing 5 to 31% Ar. After the plasma treatment, as FIG. 5C shows, using the same plasma CVD chamber, an MSQ film 8, which is a second insulating film, is formed on the adhesion promoter 7 using a plasma CVD method.

Thereby, the same effect as the effect of the first embodiment can be achieved. Furthermore, if the MSQ film is directly applied onto the fluorinated allylene film 6, the MSQ film is repelled and cannot be formed. However, the application of the above-described adhesion promoter and plasma treatment enables the MSQ film 8 to be formed, and a desired laminated structure can be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2003-161277, filed on Jun. 5, 2003 including specification, claims, drawings and summary, on which the Convention priority of the present application is based, are incorporated herein by reference in its entirety.

The invention claimed is:

1. A method for manufacturing a semiconductor device that has a multi-layer interlayer insulating film, comprising:
    forming a first insulating film as one layer of the multi-layer insulating film,
    plasma treating the first insulating film in an ambient of a gas mixture of He and Ar containing 5 to 31% Ar, and after the plasma treatment, forming a second insulating film, different from the first insulating film, as another layer of the multi-layer film, on the first insulating film.

2. The method for manufacturing a semiconductor device according to claim 1, including forming a low-dielectric-constant film as the first insulating film.

3. The method for manufacturing a semiconductor device according to claim 1, including depositing as the first insulating film, a film selected from the group consisting of MSQ (alkyl silsesquioxane), fluorinated allylene, SiOC, an organic polymer, a material containing S$_1$ and CH$_3$ groups, a material containing Si—H groups, and a porous film formed by dispersing pores in a low-dielectric-constant film, by one of spin coating and CVD (chemical vapor deposition).

4. The method for manufacturing a semiconductor device according to claim 1, including forming as the second insulating film, a film of SiO$_2$, SiN, SiC, SiCN, SiOC, and SiON by one of spin coating and CVD (chemical vapor deposition).

5. The method for manufacturing a semiconductor device according to claim 1, including plasma treating the first insulating film for 10 to 60 seconds.

6. A method for manufacturing a semiconductor device that has a multi-layer interlayer insulating film, comprising:
    forming a first insulating film as one layer of the multi-layer insulating film,
    a plasma treating the first insulating film in an ambient of a gas mixture of He and Ar containing 5 to 31% Ar, after the plasma treating, applying an adhesion promoter to the first insulating film, and forming a second insulating film, different from the first insulating film, as another layer of the multi-layer insulating films, on the adhesion promoter.

7. The method for manufacturing a semiconductor device according to claim 6, including forming a low-dielectric-constant film as the first insulating film.

8. The method for manufacturing a semiconductor device according to claim 6, including depositing, as the first insulating film, a film selected from the group consisting of MSQ (alkyl silsesquioxane), fluorinated allylene, SiOC, an organic polymer, a material containing $S_1$ and $CH_3$ groups, a material containing Si—H groups, and a porous film formed by dispersing pores in a low-dielectric-constant film, by one of spin coating and CVD (chemical vapor deposition).

9. The method for manufacturing a semiconductor device according to claim 6, including forming as the second insulating film, a film of $SiO_2$, SiN, SiC, SiCN, SiOC, and SiON by one of spin coating and CVD (chemical vapor deposition).

10. The method for manufacturing a semiconductor device according to claim 6, including applying, as the adhesion promoter, an adhesion promoter containing a silane coupling agent to the first insulating film by spin coating.

11. The method for manufacturing a semiconductor device according to claim 6, wherein the adhesion promoter has a thickness of 5 to 20 nm.

12. The method for manufacturing a semiconductor device according to claim 6, including plasma treating the first insulating film for 10 to 60 seconds.

13. A method for manufacturing a semiconductor device that has a multi-layer interlayer insulating film, comprising:

forming a first insulating film as one layer of the multi-layer insulating film, applying an adhesion promoter to the first insulating film, plasma treating the adhesion promoter in an ambient of a gas mixture of He and Ar containing 5 to 31% Ar, and after the plasma treatment, forming a second insulating film, different from the first insulating film, as another layer of the multi-layer insulating film, on the adhesion promoter.

14. The method for manufacturing a semiconductor device according to claim 13, including forming a low-dielectric-constant film as the first insulating film.

15. The method for manufacturing a semiconductor device according to claim 13, including depositing, as the first insulating film, a film selected from the grout consisting of MSQ (alkyl silsesquioxane), fluorinated allylene, SiOC, an organic polymer, a material containing $S_1$ and $CH_3$ groups, a material containing Si—H groups, and a porous film formed by dispersing pores in a low-dielectric-constant film, by one of spin coating and CVD (chemical vapor deposition).

16. The method for manufacturing a semiconductor device according to claim 13, including forming as the second insulating film, a film of $SiO_2$, SiN, SiC, SiCN, SiOC, and SiON by one of spin coating and CVD (chemical vapor deposition).

17. The method for manufacturing a semiconductor device according to claim 13, including applying, as the adhesion promoter, an adhesion promoter containing a silane coupling agent to the first insulating film by spin coating.

18. The method for manufacturing a semiconductor device according to claim 13, wherein the adhesion promoter has a thickness of 5 to 20 nm.

19. The method for manufacturing a semiconductor device according to claim 13, including plasma treating the first insulating film for 10 to 60 seconds.

* * * * *